(12) United States Patent
Halbritter et al.

(10) Patent No.: US 11,355,897 B2
(45) Date of Patent: Jun. 7, 2022

(54) LIGHT-EMITTING COMPONENT

(71) Applicant: OSRAM Opto Semiconductors GmbH, Regensburg (DE)

(72) Inventors: Hubert Halbritter, Dietfurt (DE); Roland Enzmann, Gelugor (MY); Andreas Wojcik, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 334 days.

(21) Appl. No.: 16/092,422

(22) PCT Filed: Apr. 12, 2017

(86) PCT No.: PCT/EP2017/058774
§ 371 (c)(1),
(2) Date: Oct. 9, 2018

(87) PCT Pub. No.: WO2017/178525
PCT Pub. Date: Oct. 19, 2017

(65) Prior Publication Data
US 2020/0119517 A1    Apr. 16, 2020

(30) Foreign Application Priority Data
Apr. 14, 2016   (DE) .......................... 102016106896.9

(51) Int. Cl.
*H01S 5/02255*  (2021.01)
*H01S 5/0231*  (2021.01)
*H01S 5/02234*  (2021.01)

(52) U.S. Cl.
CPC ........ *H01S 5/02255* (2021.01); *H01S 5/0231* (2021.01); *H01S 5/02234* (2021.01)

(58) Field of Classification Search
CPC ...... H01S 5/1007; H01S 5/142; H01S 5/0261; H01S 5/3402; H01S 5/0622; H01S 5/0208; H01S 5/0213; H01S 5/0218
(Continued)

(56) References Cited

U.S. PATENT DOCUMENTS 4,807,238 A  *  2/1989  Yokomori ............... H01L 33/60
                                                257/E33.072
5,341,388 A  *  8/1994  Masuda ................... H01S 3/042
                                                372/34
(Continued)

FOREIGN PATENT DOCUMENTS

CN          100583578 C      1/2010
DE          10214119 A1     10/2003
(Continued)

*Primary Examiner* — Tuan N Nguyen
(74) *Attorney, Agent, or Firm* — Slater Matsil, LLP

(57) ABSTRACT

In an embodiment a light-emitting component includes a housing and an edge emitting semiconductor laser arranged in the housing, wherein the semiconductor laser is configured to emit light at a side face in an angle range, wherein the housing includes an emission opening for emitting the light, wherein the semiconductor laser is arranged in a first layer having a first material, wherein a second layer is arranged on the first layer, the second layer having a second material, wherein the first layer and the second layer are transmissive to the light, wherein the second layer is arranged between the first layer and the emission opening, wherein the emission opening lies at least partly outside the angle range of the semiconductor laser, and wherein a part of the light is directed directly onto an interface between the first and second layers.

19 Claims, 3 Drawing Sheets

(58) Field of Classification Search
USPC .................................................. 372/4, 43.01
See application file for complete search history.

(56) References Cited

U.S. PATENT DOCUMENTS

| | | | | |
|---|---|---|---|---|
| 5,446,750 A * | 8/1995 | Ohtsuka | ................... | H01S 3/025 |
| | | | | 372/22 |
| 6,774,404 B2 | 8/2004 | Imai | | |
| 6,778,576 B1 * | 8/2004 | Acklin | ................ | H01S 5/02248 |
| | | | | 372/101 |
| 7,295,592 B2 | 11/2007 | Hiramatsu et al. | | |
| 7,304,326 B2 * | 12/2007 | Suehiro | ................... | H01L 33/56 |
| | | | | 257/100 |
| 8,033,706 B1 * | 10/2011 | Kelly | ................ | G02F 1/133606 |
| | | | | 362/607 |
| 2004/0165623 A1 * | 8/2004 | Imaki | ................... | H01S 5/0687 |
| | | | | 372/32 |
| 2005/0122720 A1 | 6/2005 | Shimonaka et al. | | |
| 2005/0226636 A1 * | 10/2005 | Hiramatsu | .......... | H01S 5/02234 |
| | | | | 398/182 |
| 2007/0012940 A1 * | 1/2007 | Suh | ................ | H01L 33/56 |
| | | | | 257/99 |
| 2008/0035942 A1 * | 2/2008 | Kim | ................ | H01L 33/505 |
| | | | | 257/98 |
| 2008/0123337 A1 * | 5/2008 | Higashi | ................ | H01L 33/58 |
| | | | | 362/267 |
| 2008/0259975 A1 * | 10/2008 | Kamijima | ........... | H01S 5/02257 |
| | | | | 372/23 |
| 2009/0262516 A1 * | 10/2009 | Li | ................ | H01L 33/56 |
| | | | | 362/84 |
| 2010/0258830 A1 * | 10/2010 | Ide | ................ | H01L 33/60 |
| | | | | 257/98 |
| 2012/0161621 A1 | 6/2012 | Sato | | |
| 2012/0287646 A1 | 11/2012 | Mandelboum et al. | | |
| 2013/0207148 A1 | 8/2013 | Krauter et al. | | |
| 2013/0214674 A1 * | 8/2013 | Inoguchi | ............ | H01L 25/0753 |
| | | | | 313/498 |
| 2013/0320380 A1 * | 12/2013 | Kanemaru | ............ | H01L 33/502 |
| | | | | 257/98 |
| 2014/0124823 A1 * | 5/2014 | Inoguchi | ............ | H01L 25/0753 |
| | | | | 257/99 |
| 2014/0192830 A1 * | 7/2014 | Blauvelt | ................ | H01S 3/137 |
| | | | | 372/32 |
| 2016/0268485 A1 * | 9/2016 | Morimura | ............ | H01L 33/508 |
| 2016/0285233 A1 | 9/2016 | Victoria et al. | | |
| 2016/0315229 A1 * | 10/2016 | Dai | ................ | H01L 33/504 |
| 2017/0170625 A1 | 6/2017 | Halbritter et al. | | |

FOREIGN PATENT DOCUMENTS

| | | |
|---|---|---|
| DE | 10314468 A1 | 11/2003 |
| DE | 102010034913 A1 | 2/2012 |
| DE | 102013210103 A1 | 12/2014 |
| DE | 102014213406 A1 | 1/2016 |
| DE | 102015108117 A1 | 11/2016 |
| JP | 2001181794 A | 7/2001 |
| WO | 0133607 A2 | 5/2001 |

\* cited by examiner

LIGHT-EMITTING COMPONENT

This patent application is a national phase filing under section 371 of PCT/EP2017/058774, filed Apr. 12, 2017, which claims the priority of German patent application 10 2016 106 896.9, filed Apr. 14, 2016, each of which is incorporated herein by reference in its entirety.

TECHNICAL FIELD

The invention relates to a light-emitting component.

BACKGROUND

A laser diode comprising at least two active layers arranged one above another is described in the prior art, for example, by International Patent Application No. WO 0133607 A2, said laser diode being arranged in an LED housing comprising a radiation-transmissive potting.

SUMMARY OF THE INVENTION

Embodiments provide an improved light-emitting component in particular for a time-of-flight measurement.

One advantage of the component described is that the component is constructed in a simple manner, and that the component is suitable for providing short light pulses for one time-of-flight measurement. This advantage is achieved by virtue of the fact that an edge emitting semiconductor laser is provided, wherein the semiconductor laser is arranged in a first light-transmissive layer. A second light-transmissive layer is applied on the first layer. The semiconductor laser is arranged in a housing, wherein an emission opening for emitting light from the housing is provided. With the aid of the arrangement described, a deflection of the light in the direction of the emission opening is achieved using simple means. The component is simple to produce and is suitable for emitting short light pulses, in particular for a time-of-flight measurement.

In one embodiment, the emission opening is arranged at least partly outside an emission angle range of the semiconductor laser. By way of example, 50% or 80% or more of the emission opening may be outside the emission angle range. As a result, a direct emission of the light proceeding from the semiconductor laser via the emission opening is not possible. Consequently, a deflection of the light in the housing and thus a longer path of the light in the first and second layers are required. By way of example, the entire emission opening may be arranged outside the emission angle range of the semiconductor laser.

In one embodiment, the interface is arranged in a manner inclined at an angle of between 45° and 135°, in particular between 70° and 110° with respect to the plane of the side face of the semiconductor laser.

In one embodiment, at least part of the light emitted by the semiconductor laser is directed directly onto an interface between the first and second layers. An improved and faster coupling-out, that is to say deflection of the light in the direction of the emission opening, is achieved in this way. The emission opening is arranged in particular parallel to the interface.

Depending on the embodiment chosen, at least 10% of the light emitted by the semiconductor laser is directed directly onto the interface between the first and second layers. A good coupling-out of the light may be achieved as a result.

In one embodiment, at least 30% of the light emitted by the semiconductor laser is directed directly onto the interface between the first and second layers. An improved coupling-out of the light may be achieved as a result. Depending on the embodiment, it is also possible for 50% or more of the light of the semiconductor laser to be radiated directly onto the interface.

In a further embodiment, a maximum of 50% or less of the light emitted by the semiconductor laser is directed directly onto the interface between the first and second layers. As a result, it is possible to achieve a sufficient direct coupling-out of the light via the interface in conjunction with a compact and simple construction.

In one embodiment, an improved deflection from the emission angle range in the direction of the emission opening is achieved. For this purpose, at least 5% more scattering particles are arranged in the second layer than in the first layer. In particular, the first layer may be free of scattering particles.

A further improvement in the deflection in the case of short light pulses is achieved by virtue of at least one part of the inner wall of the housing and/or a part of the base of the housing being formed in reflective fashion. Consequently, it is not necessary to provide a separate deflection face or a separate deflection element. The housing wall and/or the base of the housing may be used for this purpose.

In one embodiment, at least one part of the base of the housing is formed by a leadframe section or by a ceramic plate.

Experiments have shown that CaF2 particles, in particular, are suitable as scattering particles. In this case, good results were achieved with scattering particles with at least 90% thereof comprising a size of smaller than 15 μm.

The first and/or the second layer may comprise silicone, epoxy material and/or resin as light-transmissive material.

A further improvement in the deflection in the direction of the emission opening may be achieved by virtue of the first layer comprising a lower refractive index for the light of the semiconductor laser than the second layer. By way of example, the difference between the refractive indexes may be in the region of at least 0.1%, in particular of at least 1%.

In one embodiment, the interface comprises a rough, uneven structure. A coupling of the light from the first layer into the second layer is improved as a result.

In one embodiment, in the emission angle range a reflection face is arranged at an inclination with respect to the emission direction of the semiconductor laser, wherein the reflection face deflects the light of the semiconductor laser in the direction of the emission opening. Temporally shorter light pulses may be emitted as a result.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings, in which.

DETAILED DESCRIPTION OF ILLUSTRATIVE EMBODIMENTS

Figure 1:
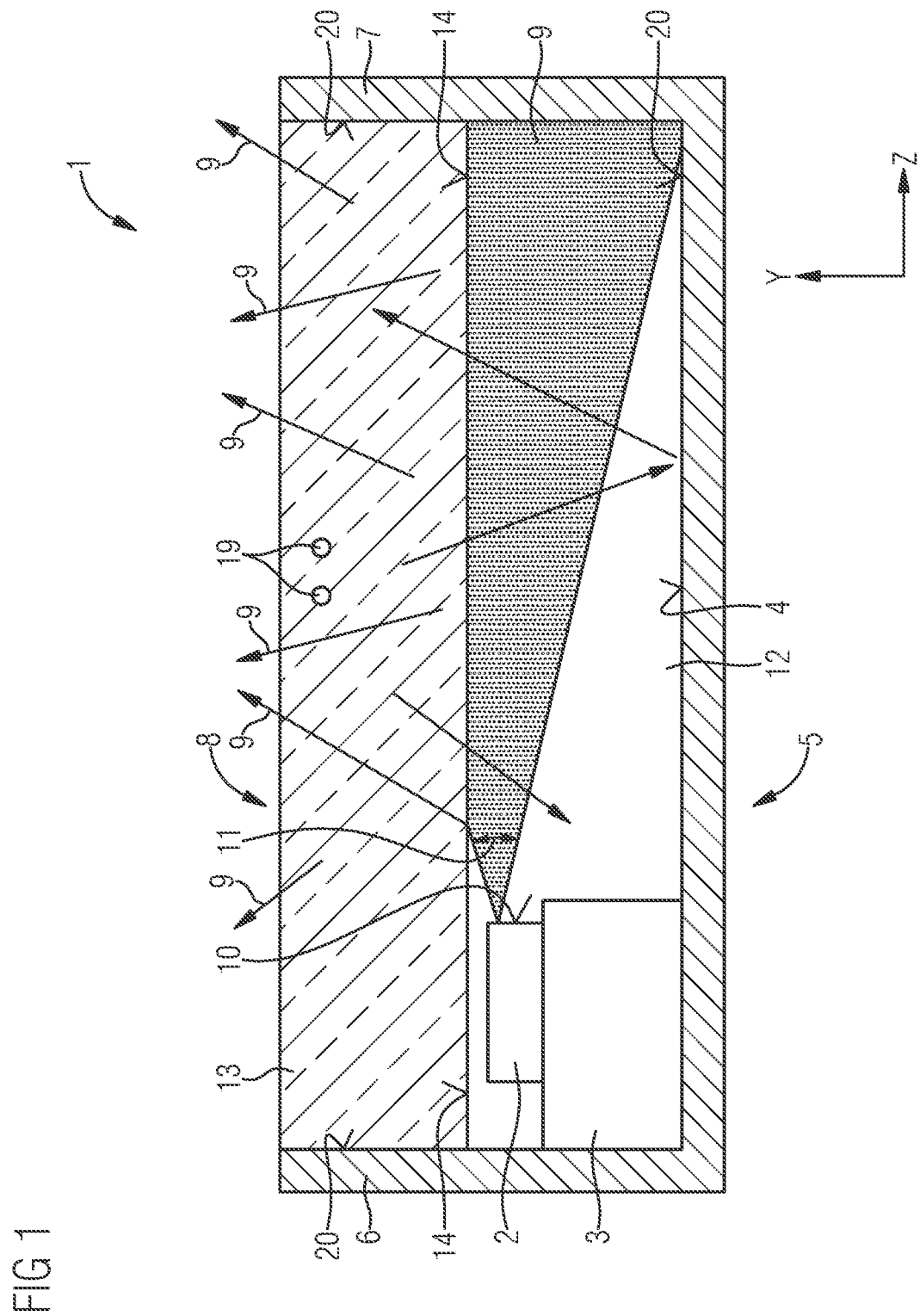
FIG. 1 shows a schematic illustration of a cross section through a light-emitting component.

FIG. 1 shows a schematic cross section through one embodiment of a light-emitting component 1 comprising an edge emitting semiconductor laser 2. The semiconductor laser 2 is arranged on a carrier 3. The carrier 3 may be formed, for example, in the form of a substrate, a leadframe or a ceramic plate. The carrier 3 is secured on a base 4 of a housing 5. The housing 5 comprises four side walls 6, 7 besides the base 4, depending on the embodiment chosen. Moreover, the housing 5 comprises an emission opening 8 for emitting light of the semiconductor laser. In the example illustrated, the emission opening 8 is arranged opposite the base 4. The emission opening 8 may comprise the same area as the base 4 or a smaller area. This is the case, for example, if the housing 5 is covered by a cover plate comprising an opening, wherein the opening constitutes the emission opening. The semiconductor laser 2 emits light 9 at a side face 10. The semiconductor laser 2 may be configured, for example, to emit infrared light or blue light. The designation light is understood to mean any electromagnetic radiation, which may be both in the visible range and in the non-visible range.

In the example illustrated, the side face 10 is arranged perpendicular to a plane of the emission opening 8. The light 9 is emitted by the semiconductor laser 2 in a predefined emission angle range 11. The emission angle range 11 is directed in the direction of a second side wall 7 of the housing 5. Depending on the embodiment chosen, the side face 10 may also be arranged at a different angle with respect to the plane of the emission opening 8. By way of example, in one embodiment, the side face 10 might be arranged parallel to the plane of the emission opening 8.

An interior of the housing 5 is filled with a first layer 12 up to a height above the semiconductor laser 2 proceeding from the base 4. A second layer 13 is arranged on the first layer 12. In the exemplary embodiment illustrated, the second layer 13 extends as far as the emission opening 8. Depending on the embodiment chosen, even further layers may be provided between the base 4 and the emission opening 8. The first and second layers 12, 13 adjoin one another via an interface 14. In the exemplary embodiment illustrated, the interface 14 is arranged perpendicular to the side face 10 of the semiconductor laser 2. Moreover, in the example illustrated, the interface 14 is arranged parallel to the base 4. Depending on the embodiment chosen, the interface 14 may also be arranged at a different angle, in particular in an angle range of between 45° and 135°, in particular between 70° and 110°, with respect to the plane of the side face 10, i.e., with respect to the side face 10. The side face 10 may be arranged in a Y-X-plane. The interface 14 may be arranged in a Y-Z-plane and perpendicular to a Y-Z-plane. Moreover, the interface 14 may be formed as a planar plane which is arranged in a manner inclined at an angle with respect to a Y-Z-plane and perpendicular to a Y-Z-plane. Moreover, depending on the embodiment chosen, the interface 14 may comprise a rough, uneven structure, such that a coupling of light 9 from the first layer 12 into the second layer 13 is improved.

Depending on the embodiment chosen, the emission angle range 11 in which light 9 is emitted by the semiconductor laser 2 is directed at least partly onto the interface 14. This means that at least part of the light 9 emitted by the semiconductor laser 2 impinges directly on the interface 14. The partial range may be between 10% and 50% or even above 50% of the light 9 emitted by the semiconductor laser 2.

The first layer 12 comprises a first material. The second layer 13 comprises a second material. The first and second materials are transmissive to the light 9 of the semiconductor laser. Transmissive is understood to mean a material which transmits at least 50%, in particular 90%, of the light 9. The first and second materials may be identical or different. The light-transmissive material may be, for example, silicone, epoxy material or resin. Depending on the embodiment chosen, the first and/or the second layer 12, 13 may comprise scattering particles 19. By way of example, the second layer may comprise at least 5 percent by volume more scattering particles 19 than the first layer 12. Moreover, the scattering particles 19 both in the first and in the second layer 12, 13 may be constituted from the same material or from different materials. Depending on the embodiment chosen, the first layer 12 and the second layer 13 may be formed without scattering particles 19. CaF2 particles, for example, may be used as scattering particles 19. However, the scattering particles 19 may also consist of other materials. The size of the particles may be smaller than 15 µm. Depending on the embodiment chosen, the scattering particles 19 may comprise on average a size of between 0.5 µm and 3 µm. On average means that at least 80%, in particular 90%, of the particles are in this size range of between 0.5 µm and 3 µm.

Furthermore, the refractive index of the second layer 13 may be greater than the refractive index of the first layer 12. The difference in refractive index may be greater than 0.1%, in particular greater than 1%. In this case, the refractive index relates to the wavelength of the light 9 that is emitted by the semiconductor laser 2.

Depending on the embodiment chosen, at least one inner wall of the housing 5 and/or the base 4 of the housing 5 may comprise a reflective surface 20. An improved deflection of the light 9 in the direction of the emission opening 8 is achieved with the aid of the reflective surfaces 20. The reflective surface 20 may be formed as a mirror layer, as a reflective layer or as a metallic layer. By way of example, the base 4 may be constituted at least partly by a leadframe section on which the semiconductor laser 2 or the carrier 3 is mounted. Moreover, the base 4 may be formed at least partly as a ceramic plate on which the semiconductor laser 2 is mounted. The ceramic plate may be constituted, e.g., from an aluminum nitride ceramic.

Figure 2:
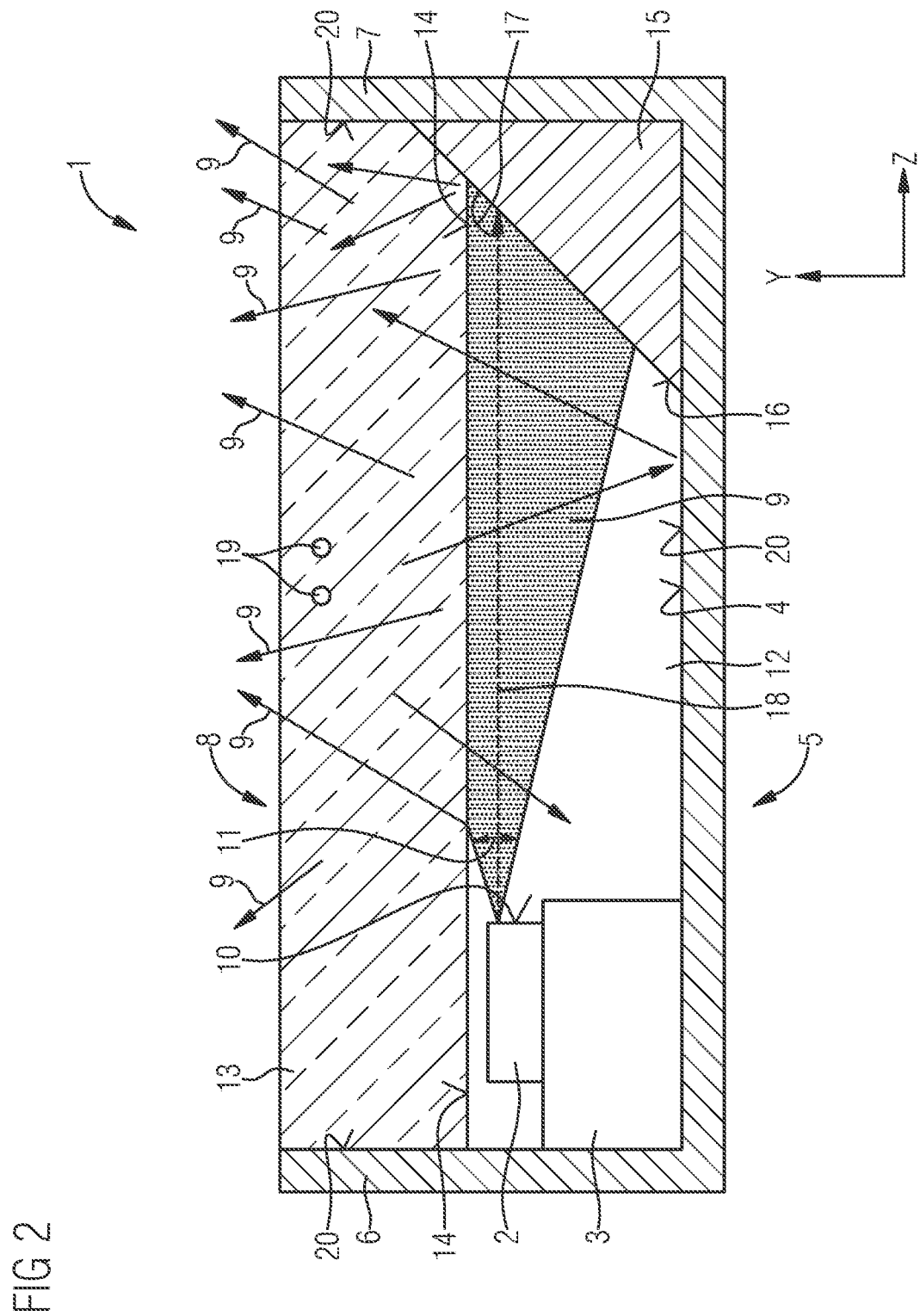
FIG. 2 shows a schematic cross section through a further embodiment of a light-emitting component.

FIG. 2 shows a further embodiment of the component 1, which may be formed substantially in accordance with the described embodiments in FIG. 1, but wherein in addition a deflection element 15 comprising a reflection face 16 is arranged in the housing 5. In the example, the deflection element 15 is arranged on the base 4 in a manner adjoining the second side wall 7 and located opposite the side face 10 of the semiconductor laser 2. The deflection element 15 may extend transversely over an entire width of the housing, i.e., in an X-direction. The deflection element 15 may itself be constituted from a reflective material or from reflective layers. Moreover, the deflection element 15 may be constituted from a non-reflective material, e.g., from plastic or silicone. By way of example, the deflection element 15 may be produced with the aid of a potting compound that is introduced into the housing 5. Afterward, the reflection face 16 is deposited on the deflection element 15, for example, as a mirror layer comprising dielectric layers and/or comprising at least one metallic layer. The first layer 12 is then introduced into the housing, wherein the first layer 12 covers the reflection face 16. The reflection face 16 and the deflection element 15 may, as illustrated, project into the second layer 13. By way of example, the deflection element 15 and the reflection face 16 may extend as far as the emission opening 8. The deflection element 15 may consist, for example, of the same material as the first and/or the second layer.

The reflection face 16 is formed as a planar face or as an uneven face. The reflection face 16 is arranged in a manner inclined at a predefined angle 17, in particular in an angle range, with respect to an average emission direction 18 of the semiconductor laser 2. The average emission direction 18 is defined by a center of the emission angle range 11 in a Y-direction. The Y-direction is arranged parallel to the side face 10. The angle 17 relative to the average emission direction 18 is chosen in such a way that light 9 that impinges on the reflection face 16 is deflected to a greater extent in the direction of the interface 14 and in the direction of the emission opening 8. An emission of the light 9 from the emission opening 8 with on average a shorter path length in the component 1 is thus achieved. Shorter light pulses comprising higher energy may be emitted as a result. The deflection element 15 and/or the reflection face 16 may be constituted, for example, from metal or dielectric materials. Moreover, the deflection element may be constituted, e.g., from a plastic or from silicone. In particular, the reflection face 16 may be formed on the deflection element 15, e.g., as a mirror face. Depending on the embodiment chosen, the first and/or the second layer may comprise phosphor for shifting the wavelength of the light 9.

Figure 3:
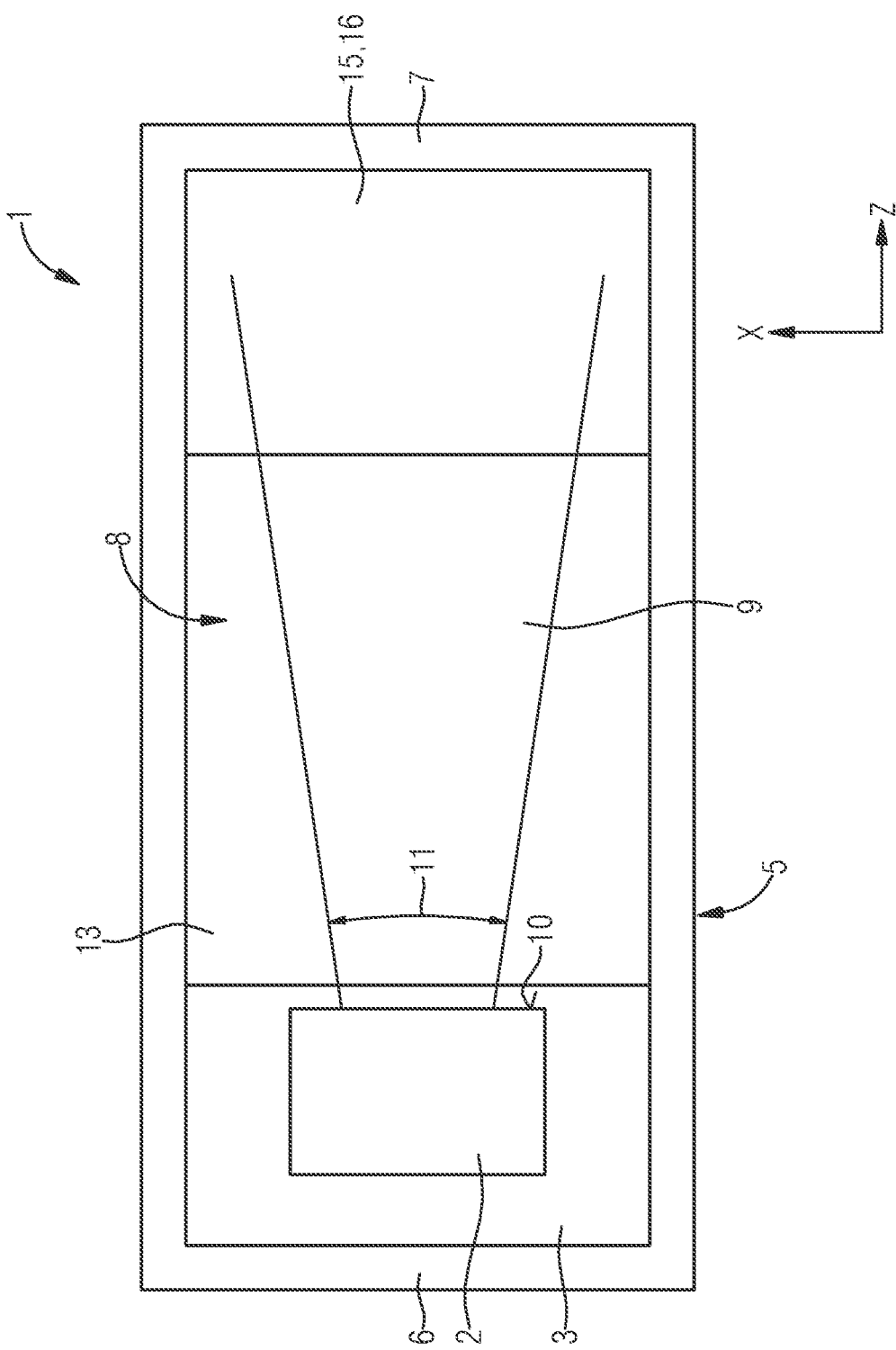
FIG. 3 shows a schematic plan view from above of the component from FIG. 2.

FIG. 3 shows a schematic view looking from above at the component from FIG. 2.

The component 1 described is suitable in particular for time-of-flight measurements (time-of-flight applications) since the component comprises a small structural height. The semiconductor laser 2 is configured to generate short light pulses, for example, shorter than 10 nanoseconds, in particular shorter than 5 nanoseconds (FWHM). Moreover, the semiconductor laser may be configured to be able to generate light pulses comprising a rise time of the power up to the maximum and the fall time from the maximum down to substantially no power which are in the range of less than 5 nanoseconds. Moreover, the power of the semiconductor laser may be in the range of 10 watts or more. The semiconductor laser is configured to be driven in such a way that a plurality of light pulses are emitted in succession with a frequency of a few kilohertz. By way of example, the component 1 may be used for distance measurement in a vehicle. The semiconductor laser 2 may comprise an emission angle range 11 comprising, e.g., an aperture angle of 25° in the vertical direction (Y-direction) and an aperture angle of 11° in the horizontal direction (X-direction) relative to half the emission power (FWHM). Moreover, depending on the embodiment chosen, in addition to the component 1, optical elements may be provided in particular outside the housing 5, e.g., above the emission opening 8, in order to direct the light 9 emitted by the component 1 in a desired direction.

By way of example, the component 1 may be used for a range measurement, for a scanning of workpieces, for a speed measurement and for a distance measurement in particular in a vehicle. Distances in the range of up to a few 100 m may be detected in this case. In particular, the component 1 may be used for an automatic speed regulation of a vehicle. An electronic circuit that is necessary for the pulsed driving of the semiconductor laser 2 is not illustrated and not explained in more specific detail.

Although the invention has been more specifically illustrated and described in detail by means of the preferred exemplary embodiment, nevertheless the invention is not restricted by the examples disclosed and other variations may be derived therefrom by the person skilled in the art, without departing from the scope of protection of the invention.

The invention claimed is:

1. A light-emitting component comprising:
   a housing; and
   an edge emitting semiconductor laser arranged in the housing,
   wherein the semiconductor laser is configured to emit light at one side face in an angle range,
   wherein the housing comprises an emission opening for emitting the light,
   wherein the semiconductor laser is arranged in a first layer comprising a first material,
   wherein a second layer is arranged at an interface on the first layer, the second layer comprising a second material,
   wherein the first layer and the second layer are arranged in the housing,
   wherein the first layer and the second layer are transmissive to the light,
   wherein the second layer is arranged between the first layer and the emission opening,
   wherein the emission opening lies at least partly outside the angle range of the semiconductor laser,
   wherein a part of the light is directed directly onto the interface located between the first and second layers,
   wherein the first layer comprises a lower refractive index for the light than the second layer,
   wherein the refractive indexes of the first and second layers differ by at least 0.1%, and
   wherein the interface is inclined at an angle of between 45° and 135° with respect to the side face of the semiconductor laser.

2. The component according to claim 1, wherein the semiconductor laser is configured to emit light only at the one side face, and wherein at least 10% of the light is directed directly onto the interface between the first and second layers.

3. The component according to claim 2, wherein a maximum of 50% of the light is directed directly onto the interface between the first and second layers.

4. The component according to claim 1, wherein the second layer comprises at least 5% more scattering particles than the first layer, and/or wherein no scattering particles are arranged in the first layer.

5. The component according to claim 4, wherein at least 90% of the scattering particles comprise a size that is smaller than 15 μm.

6. The component according to claim 1, wherein at least one part of an inner wall of the housing comprises a surface that reflects the light.

7. The component according to claim 1, wherein the semiconductor laser is secured on a base of the housing, and wherein the base comprises a surface that reflects the light.

8. The component according to claim 7, wherein the base is formed at least partly as a leadframe section or as a ceramic plate.

9. The component according to claim 1, wherein the interface comprises a rough, uneven structure.

10. The component according to claim 1, wherein a reflection face arranged at an inclination with respect to the angle range is provided in the first layer, wherein the reflection face is configured to deflect the light in a direction of the emission opening, and wherein the reflection face is arranged on a deflection element.

11. The component according to claim 1, wherein the semiconductor laser is a pulsed laser, and wherein the semiconductor laser is configured to generate short light pulses shorter than 10 nanoseconds.

12. The component of claim 1, wherein the housing comprises a base and four side walls, wherein the emission opening is arranged opposite the base, wherein the side face of the semiconductor laser configured to emit the light is arranged perpendicular to a plane of the emission opening, and wherein an emission angle range is directed in a direction of one of the side walls of the housing and in a direction of the interface.

13. The component of claim 1, wherein an emission angle range in which the light is emitted by the side face of the semiconductor laser is directed at least partly onto the interface, and wherein between 10% and 50% of the light emitted by the side face of the semiconductor laser impinges directly on the interface.

14. The component of claim 1, wherein the housing comprises a base, a first side wall and a second side wall opposite to the first side wall, wherein the semiconductor laser is arranged adjacent to the first side wall, and wherein the semiconductor laser is configured to emit the light only at the one side face in a direction to the second side wall of the housing.

15. The component of claim 1, wherein the semiconductor laser is a pulsed laser, wherein the semiconductor laser is configured to:
generate short light pulses shorter than 10 nanoseconds; and
generate light pulses comprising a rise time of a power up to a maximum and a fall time from the maximum down to substantially no power which are in a range of less than 5 nanoseconds.

16. The component of claim 15, wherein a power of the semiconductor laser is in a range of 10 watts or more, and wherein the semiconductor laser is configured to be driven in such a way that a plurality of light pulses is emitted in succession with a frequency of a few kilohertz.

17. A light-emitting component comprising:
a housing; and
an edge emitting semiconductor laser arranged in the housing,
wherein the semiconductor laser is configured to emit light only at one side face in an angle range,
wherein the housing comprises an emission opening for emitting the light,
wherein the semiconductor laser is arranged in a first layer comprising a first material,
wherein a second layer is arranged at an interface on the first layer, the second layer comprising a second material,
wherein the first layer and the second layer are arranged in the housing,
wherein the first layer and the second layer are transmissive to the light,
wherein the second layer is arranged between the first layer and the emission opening,
wherein the emission opening lies at least partly outside the angle range,
wherein a part of the light is directed directly onto the interface located between the first and second layers,
wherein the first layer comprises a lower refractive index for the light than the second layer,
wherein the refractive indexes of the first and second layers differ by at least 0.1%,
wherein the interface is inclined at an angle of between 45° and 135° with respect to the side face of the semiconductor laser,
wherein a reflection face arranged at an inclination with respect to the angle range is provided in the first layer,
wherein the reflection face is configured to deflect the light in a direction of the emission opening,
wherein the reflection face is located on a deflection element, and
wherein the deflection element is arranged on a base of the housing in a manner adjoining a second side wall and located opposite to the light emitting side face of the semiconductor laser.

18. The component of claim 17, wherein the housing comprises the base, a first side wall and the second side wall opposite to the first side wall, wherein the semiconductor laser is arranged on a carrier, wherein the carrier is secured on the base of the housing adjacent to the first side wall, wherein the semiconductor laser is configured to emit the light only at the one side face in a direction to the second side wall of the housing, wherein an interior of the housing is filled with the first layer up to a height above the semiconductor laser proceeding from the base of the housing, and wherein the second layer is provided in the interior of the housing on the first layer.

19. A light-emitting component comprising:
a housing; and
an edge emitting semiconductor laser arranged in the housing,
wherein the semiconductor laser is configured to emit light only at one side face in an angle range,
wherein the housing comprises an emission opening for emitting the light,
wherein the semiconductor laser is arranged in a first layer comprising a first material,
wherein a second layer is arranged at an interface on the first layer, the second layer comprising a second material,
wherein the first layer and the second layer are arranged in the housing,
wherein the first layer and the second layer are transmissive to the light,
wherein the second layer is arranged between the first layer and the emission opening,
wherein the emission opening lies outside the angle range of the semiconductor laser,
wherein a part of the light is directed directly onto the interface located between the first and second layers,
wherein the first layer comprises a lower refractive index for the light of the semiconductor laser than the second layer,
wherein the refractive indexes of the first and second layers differ by at least 0.1%,
wherein the interface is inclined at an angle of between 45° and 135° with respect to the side face of the semiconductor laser, and
wherein the semiconductor laser is configured to:
generate short light pulses shorter than 10 nanoseconds;
generate light pulses comprising a rise time of a power up to a maximum and a fall time from the maximum down to substantially no power which are in a range of less than 5 nanoseconds; and
be driven in such a way that a plurality of light pulses is emitted in succession with a frequency of a few kilohertz.

* * * * *